United States Patent [19]
Perry

[11] Patent Number: 4,968,589
[45] Date of Patent: Nov. 6, 1990

[54] PROBE CARD FOR INTEGRATED CIRCUIT CHIP AND METHOD OF MAKING PROBE CARD

[75] Inventor: Edward R. Perry, Chandler, Ariz.

[73] Assignee: General Signal Corporation, Stamford, Conn.

[21] Appl. No.: 262,891

[22] Filed: Oct. 26, 1988

[51] Int. Cl.$^5$ .................. G03C 5/00; G01R 19/00
[52] U.S. Cl. .................. 430/314; 430/319; 430/258; 204/15; 324/158 P
[58] Field of Search .............. 430/315, 318, 319, 329, 430/256, 258, 314; 324/158 P; 204/15

[56] References Cited

U.S. PATENT DOCUMENTS

| | | | |
|---|---|---|---|
| 3,669,665 | 6/1972 | Faigenbaum et al. | 430/258 |
| 4,159,222 | 6/1979 | Lebow et al. | 156/632 |
| 4,306,925 | 12/1981 | Lebow et al. | 156/150 |
| 4,649,338 | 3/1987 | Dugan | 324/158 P |
| 4,754,317 | 6/1988 | Comstock et al. | 357/70 |
| 4,757,256 | 7/1988 | Whann et al. | 324/158 P |
| 4,878,294 | 11/1989 | Dugan et al. | 29/852 |

OTHER PUBLICATIONS

Barsetti et al., "New Probe Cards Replace Needle Types," *Semiconductor Internat.*, Aug. 1988, pp. 98–101.

*Primary Examiner*—Jose Dees
*Attorney, Agent, or Firm*—Ellsworth R. Roston; Charles H. Schwartz; Joseph P. Abate

[57] ABSTRACT

Probes are formed on a support in a pattern to engage pads on an integrated circuit chip and leads on a printed circuit board. As a preliminary step, a thin layer of a conductive material may be formed on the support. The probes may then be formed by (a) providing facsimiles of the probes on a disposable member, (b) providing a photoresist on the support, (c) adhering the facsimiles to the support in a relationship providing for an easier removal of the disposable member from the facsimiles than the support, (d) developing the photoresist in the areas not occupied on the support by the facsimiles, (e) removing the disposable member, and then the facsimiles, from the support, (f) forming the probes on the support in the spaces previously occupied by the facsimiles and (g) removing the photoresist from the support. The probes (and the thin conductive layer) may then be transferred to a first surface of a dielectric substrate as by adhering an epoxy to the probes and the dielectric substrate and curing the epoxy. The probes (and the thin conductive layer) may then be removed from the support because the epoxy has a greater affinity to the dielectric substrate than to the support. The thin conductive layer may then be removed from the spaces between the probes; a ground plane may be formed on the opposite surface of the dielectric substrate; and contacts may be formed on the opposite ends of the probes to engage the chip pads and the board leads. The probe cards formed by such methods are also within the invention.

33 Claims, 5 Drawing Sheets

PROBE CARD FOR INTEGRATED CIRCUIT CHIP AND METHOD OF MAKING PROBE CARD

This invention relates to methods of making probe cards for testing the operativeness of integrated circuit chips. The invention particularly relates to methods of manufacturing probe cards to provide a large number of probes on the probe cards in a precise configuration with predictable characteristics and at a relatively low cost. The invention also relates to probe cards manufactured by such methods.

Integrated circuit chips are manufactured in increasing quantities to perform a variety of tasks in a wide number of different fields including data processing, data communications and computer computations. With the progression of time, the integrated circuit chips have become increasingly complex For example, initially the integrated circuit chips may have had only a few pads (or terminals) for connection to terminals external to the chip. Furthermore, the integrated circuit chips were relatively large so that there was a considerable spacing between the pads (or terminals) on the chips Now the chips are quite small and complex. As the size of the chips has decreased, the circuitry on the chips has become increasingly complex. As a result, there are now often hundreds of pads (or terminals) on a chip.

Probe cards have been provided for testing the operativeness of integrated circuit chips. The probe cards have a plurality of probes (or electrical leads) on a dielectric substrate. Each of the probes is disposed on the dielectric substrate to contact an individual one of the pads (or terminals) on the chip at one end of such probe. The other end of the probe engages an individual lead on a printed circuit board. These board leads are in turn connected to circuitry which is individually designed for each integrated circuit chip to test the circuitry on such chip.

The probes on the probe card have to be precisely positioned to contact the pads on the integrated circuit chip with a particular pressure so that the proper impedance will be produced in the testing circuitry. Because of this, the different probes on the probe card have to be precisely positioned relative to one another so that the contacts at the ends of the probes lie in the same horizontal plane and at positions for engaging the associated pads on the chip.

In view of the above, the probes have had to be assembled on the probe card manually. Only people with great manual dexterity have been able to assemble the probes on the probe cards, particularly when hundreds of probes have to be assembled on the probe cards. This has caused the price of probe cards to become astronomical. For example, prices as high as twenty five dollars ($25) per probe are now often charged for each probe card. For a probe card having four hundred (400) probes, the price for a probe card can accordingly be as high as ten thousand dollars ($10,000). Furthermore, as long as a week has been required to make a single probe card. An additional problem is that no two (2) probe cards are ever alike even when they are made to test the same integrated circuit chip. Because of this, a test of the same integrated circuit chip by different probe cards of identical design may not produce the same results.

The problems discussed in the previous paragraphs have been known for some time. The problems have been addressed with increasing intensity through the years as the integrated circuit chips have decreased in size and, at the same time, become increasingly complex. In spite of this, the problem still exists. Probe cards still are made manually. The prices for the probe cards remain high. Deliveries of probe cards are often scheduled beyond the time that manufacturers of integrated circuit chips desire such probe cards because of the long times required to manufacture the cards. And probe cards of identical design do not have the same characteristics.

In one embodiment constituting applicants invention for a method of forming probe cards, probes are formed on a support in a pattern to engage pads on an integrated circuit chip and leads on a printed circuit board. As a preliminary step, a thin layer of a conductive material may be formed on the support. The probes may be formed by (a) providing facsimiles of the probes on a disposable member, (b) providing a photoresist on the support, (c) adhering the facsimiles to the support in a relationship providing for an easier removal of the disposable member from the facsimiles than the support, (d) developing the photoresist in the areas not occupied on the support by the facsimiles, (e) removing the disposable member, and then the facsimiles, from the support, (f) forming the probes on the support in the spaces previously occupied by the facsimiles and (g) removing the photoresist from the support.

After forming the probes on the support in the method constituting applicant's invention, the probes (and the thin conductive layer) may be transferred to a first surface of a dielectric substrate as by adhering an epoxy to the probes and the dielectric substrate and curing the epoxy. The probes (and the thin conductive layer) may then be removed from the support because the epoxy has a greater affinity to the dielectric substrate than to the suport. The thin conductive layer may then be removed from the spaces between the probes; a ground plane may be formed on the opposite surface of the dielectric substrate; and contacts may be formed on the opposite ends of the probes to engage the chip pads and the board leads. The probe cards formed by such methods are also within the invention. In addition to a number of other advantages, the probe cards of this invention have the advantage that the probes are not undercut. This further assures that the impedances of the probes on the probe cards will be within predetermined close tolerances.

Figure 1:
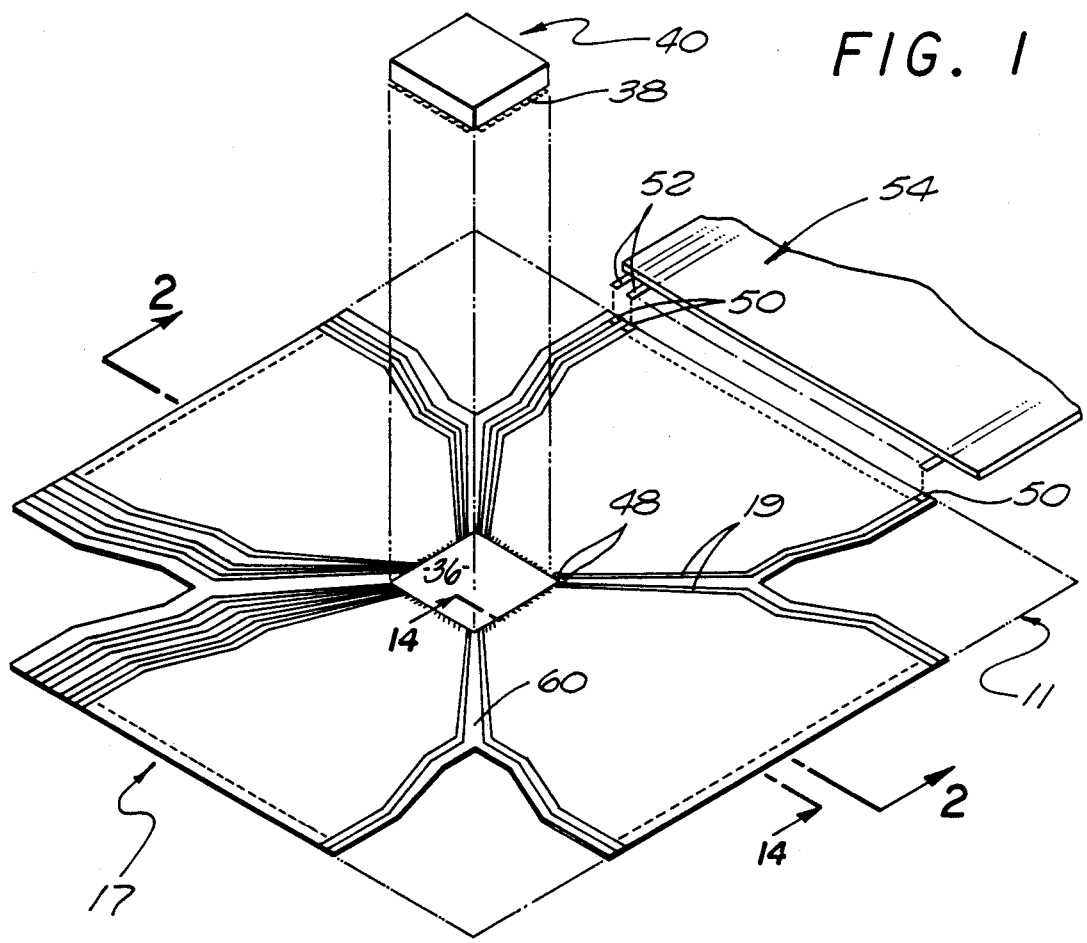
FIG. 1 is a schematic perspective view, partly exploded, of a probe card constituting one embodiment of an invention for testing the operability of an integrated circuit chip.

In one embodiment of the invention, a probe card generally indicated at 17 (FIGS. 1 and 2) include a dielectric substrate 11. A plurality of probes 19 are disposed on one surface of the dielectric substrate 11 to contact at their inner ends, pads 38 on an integrated circuit chip generally indicated at 40. To facilitate the contacts between the probes 19 and the pads 38 on the integrated circuit chip 40, the dielectric substrate is indented as indicated at 25 in FIG. 2. At their outer ends, the probes 19 contact leads 52 on a printed circuit board generally indicated at 54. A ground plane 44 is disposed on the opposite side of the dielectric substrate 11 from the probes 19. The leads 52 on the printed circuit board 54 may be connected to circuitry (not shown) for testing the operability of the integrated circuit chip 40.

As a first step in forming the probe card 17, a support plate or member 10 (FIGS. 3 and 3A) made from a suitable material such as a stainless steel (preferably of the 300 series) is provided. The stainless steel plate 10 is preferably at least one sixteenth inch thick and is preferably finished to a 400 grit finish (Matte). The bottom surface, the side surfaces and the perimeter of the top surface of the support member 10 may be masked as by a suitable tape 12 (FIGS. 3 and 3A) so that only the central portion 13 of the top surface of the support member 10 is exposed. The exposed surface 13 of the support member 10 preferably has a rectangular area corresponding to the area of the dielectric substrate 11 (FIGS. 1 and 2) plus an additional border of approximately one half inch (½") on each side.

Figure 3:
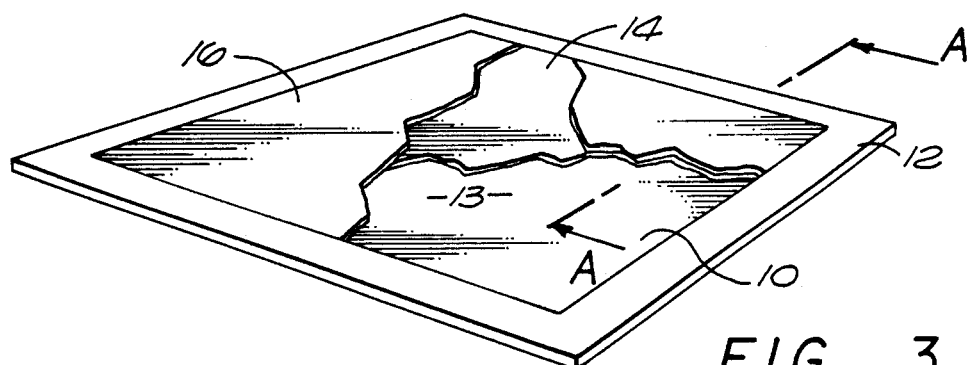
FIGS. 3–14 (including FIGS. 3A and 7A) show the probe card at various stages in the fabrication of the probe card, some of these Figures also schematically showing apparatus for processing the probe cards in some of the stages of such fabrication.
Figure 3A:
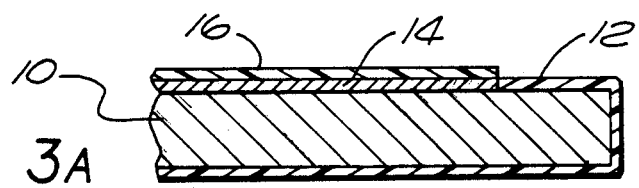

A thin layer of a suitable conductor material 14 such as copper may then be deposited in a conventional manner on the exposed top surface of the support member 10 such as shown in FIGS. 3 and 3A. The layer of the conductive material 14 may have a suitable thickness such as approximately three ten thousandths of an inch (0.003"). The material of the support member 10 may be chosen so that the layer of the conductive material 14 such as copper does not have a great affinity to the support member. In this way, the layer of the conductive material 14 may be subsequently stripped from the support member 10.

A layer of a photoresist 16 (FIGS. 3 and 3A) may be subsequently deposited in a conventional manner on the layer of the conductive material 14. The photoresist 16 may be disposed on the conductive material 14 in a thickness corresponding to the thickness of the probes which are desired to be provided on a probe card. The photoresist used may be that designated as Dynechem HG 0.002".

Figure 4:
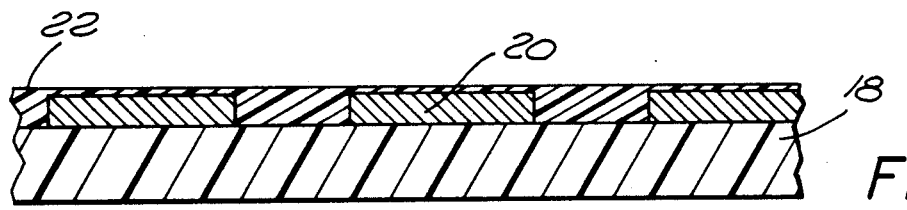

A thin strip 18 of a disposable material such as Mylar (FIG. 4) is then provided. An emulsion 20 (FIG. 3) made from a suitable material is disposed on the Mylar strip 18 in a pattern corresponding to the pattern of the probes 19 (FIG. 1) to be produced on the dielectric substrate 11. The Mylar strip 18 and the spaces between the emulsion 20 may then be covered with a suitable affinity material 22 such as a paste wax made by Johnson so that the affinity material forms a smooth surface on the Mylar strip 18. For example, a carnauba wax made by Johnson may be used. Carnauba wax is desirable because it has greater affinity to the support member 10 and the emulsion 20 than to the Mylar strip 18.

Figure 5:
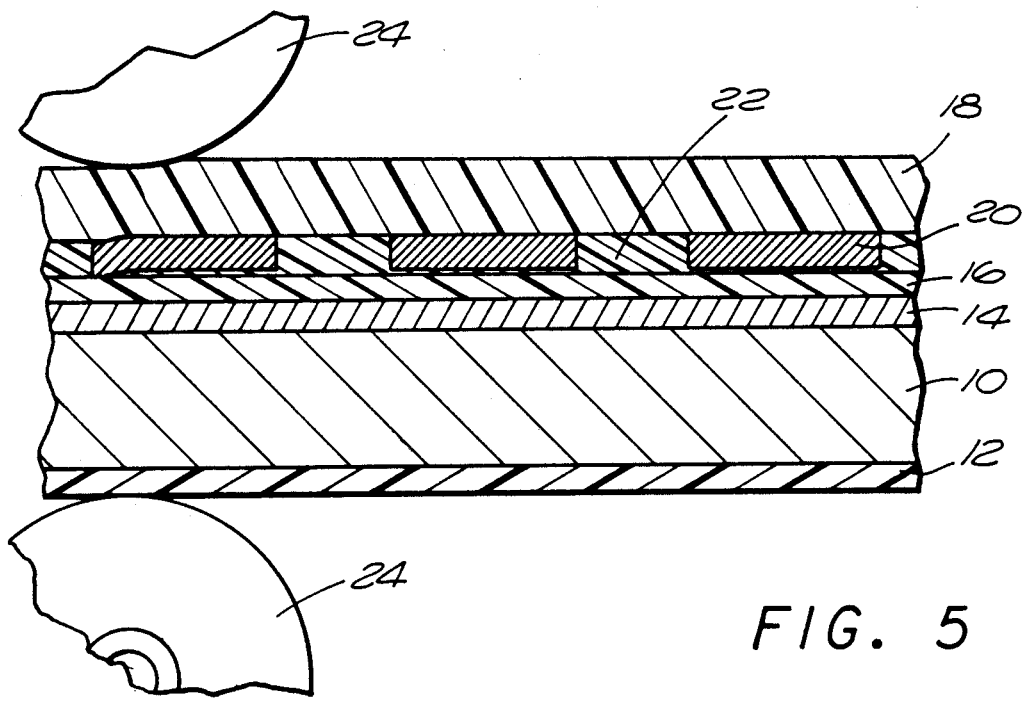
Figure 6:
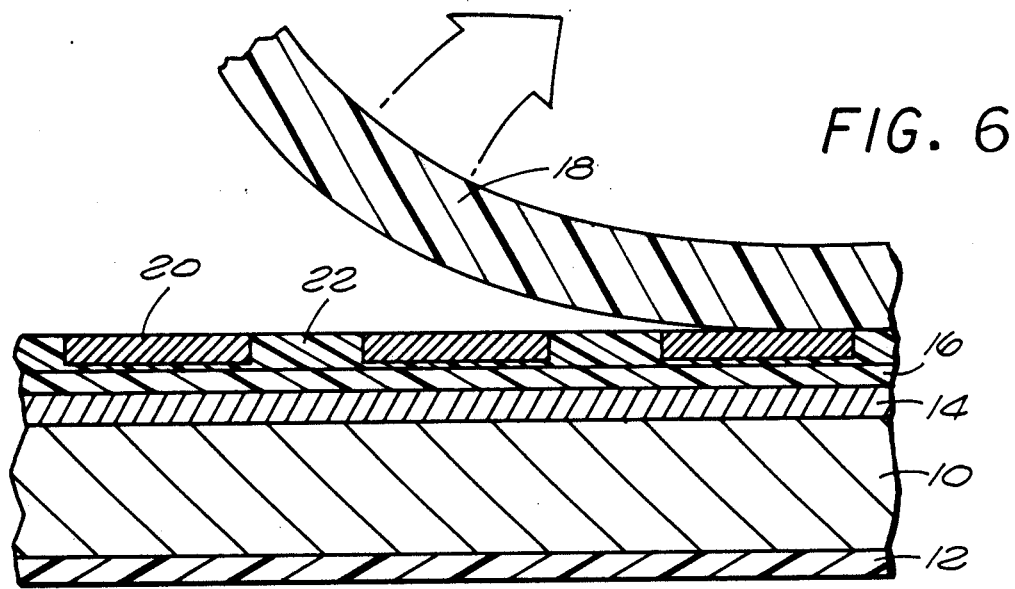

The support member 10 and the Mylar strip 18 may then be passed between rollers 24 (FIG. 5) to press the Mylar strip tightly against the support member 10. These members are held against each other because of the adhesion provided by the affinity material 22. The Mylar strip 18 may then be removed from the support member 10 as by a peeling action as shown schematically in FIG. 6. The emulsion 20 and the affinity material 22 remain on the support member 10.

Figure 7:
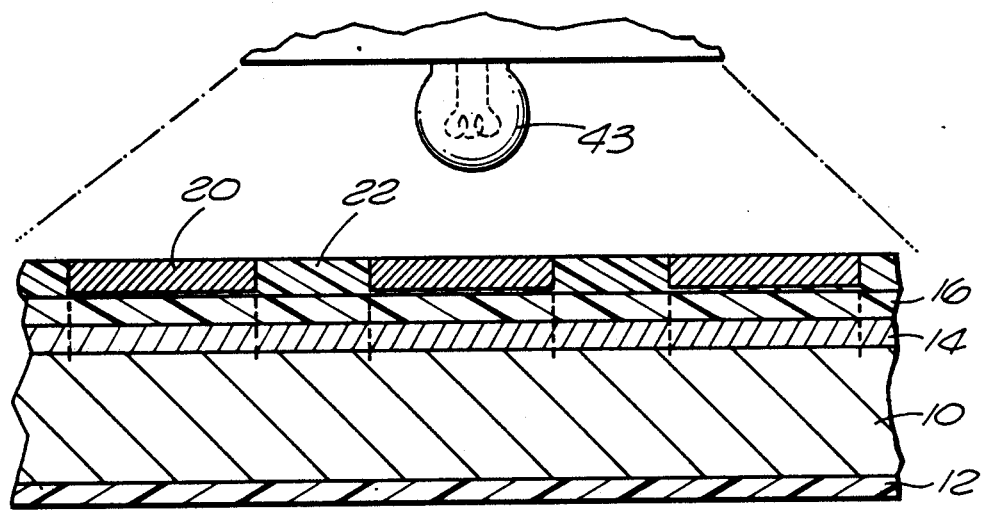

The photoresist material 16 may then be developed in a conventional manner as by applying light from a lamp 23 (FIG. 7) to the photoresist material. The developer used may be Dynachem KB-LA and the light applied may be from a five hundred watt (500 W.) flood lamp or the equivalent. The affinity material 22, the emulsion 20 and the photoresist material 16 may subsequently be removed as by stripping in a conventional manner. The stripper used may be Dynachem Alkastrip. As will be appreciated, the photoresist material 16 is undeveloped in the areas corresponding to the disposition of the emulsion 20 on the dielectric substrate 11 so the emullsion can be removed from the support member 10.

Figure 2:
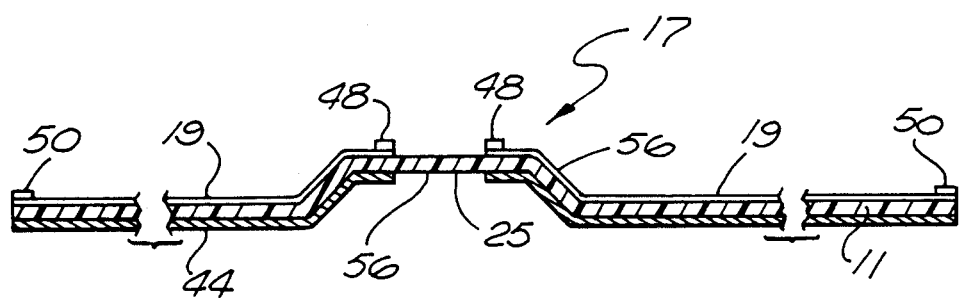
FIG. 2 is a sectional view of the probe card shown in FIG. 1 and is taken substantially on the line 2—2 of FIG. 1.
Figure 7A:
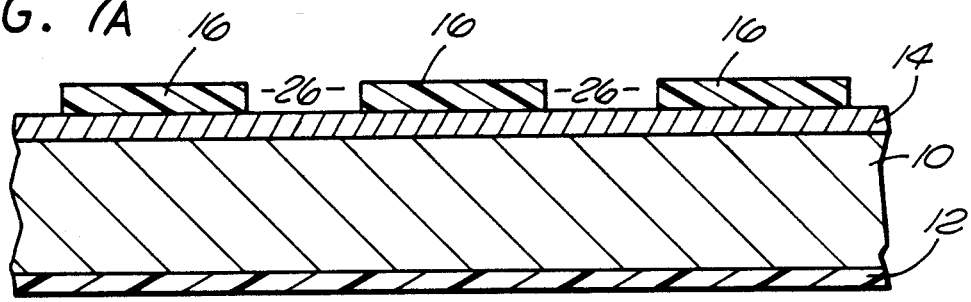
Figure 8:
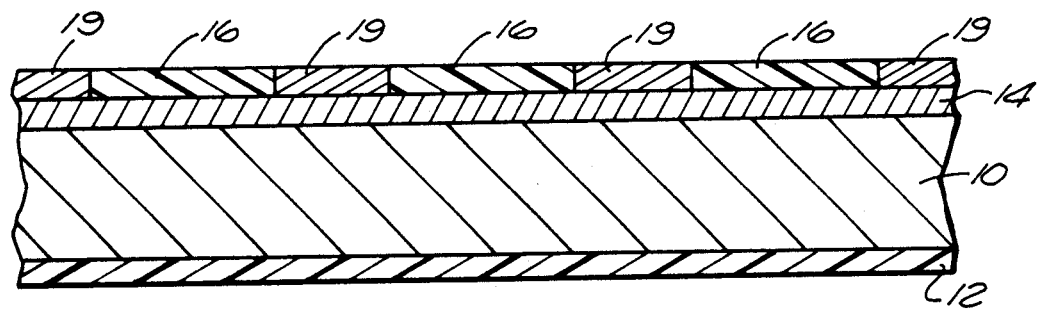
Figure 9:
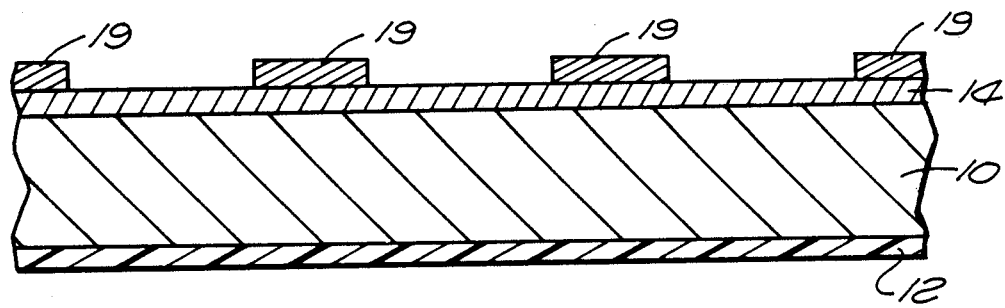

The resultant gaps 26 (FIG. 7A) produced on the surface of the support member 10 correspond in position to the disposition of the probes 19 of the dielectric substrate 11 in FIG. 1 The probes 19 are then formed in a conventional manner in the gaps 26 as illustrated in FIG. 8. The probes 19 may be made from a suitable material such as copper. The thickness of the probes 19 may correspond to the thickness of the developed photoresist 16 on the support member 10. The developed photo resist material 16 may thereafter be removed from the support member, 10 in a conventional manner as illustrated in FIG. 9.

Figure 10:
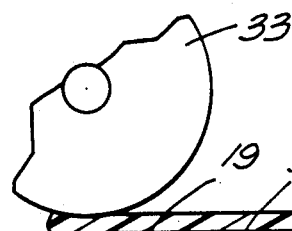

The edges of the support member 10 may then be taped as at 30 in FIG. 10. The tape 30 preferably overlaps the area plated with the conductive layer 12. The area within the tape 30 is then coated with a binder material 32 such as a clear epoxy. The epoxy may be designated as Hysol 0151. The epoxy covers the probes 19 in a thin layer and fills the spaces between the probes to provide a smooth surface. Any excess of the binder material 32 may be rolled out in a conventional manner. The dielectric substrate 11 is then adhered to the binder material 32 as by rollers 33 as in FIG. 9. The adhering may be facilitated by pressing the dielectric substrate 11 against the support member 10 to cure the binder material. The binder material 32 is selected so that it has a greater affinity to the dielectric substrate 11 than to the support member 10.

Figure 11:
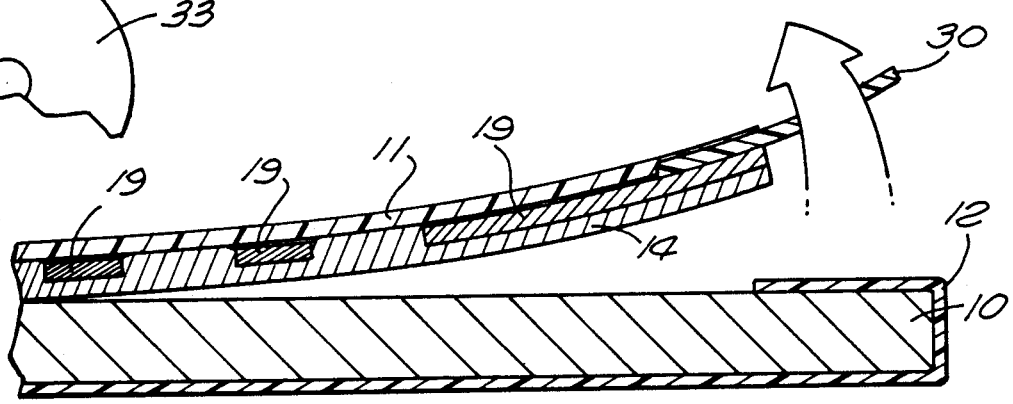
Figure 12:
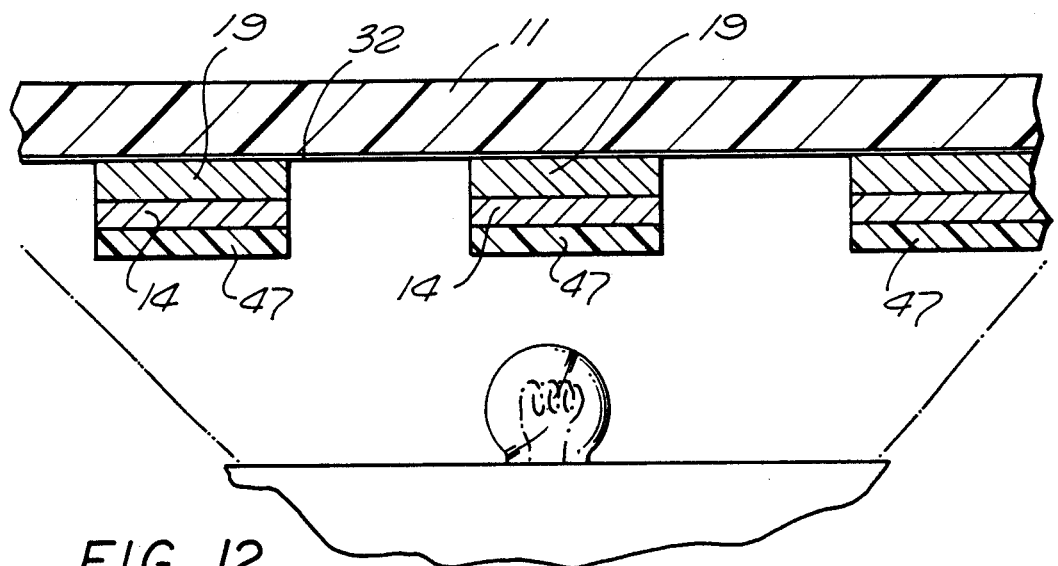

The tape 30 may then be peeled from the support member 10 as shown schematically in FIG. 11. As the tape 30 is peeled, the probes 19 and the thin layer 14 of the conductive material are lifted from the support member 10. In this way, the probes 19 and the thin layer 14 of the conductive material become transferred to one surface of the dielectric substrate 11. The thin layer 12 of the conductive material may then be removed from the dielectric substrate 11 in the spaces between the probes 19 as shown in FIG. 11. This may be accomplished in a conventional manner by disposing a photo resist 46 on the conductive layer 14 in the spaces between the probes, developing the photo resist (as by light from a source 43 in FIG. 7) on the conductive layer corresponding to the position of the surface of the probes, removing the undeveloped photo resist on the conductive layer 14, removing the conductive layer 14 in the spaces between the probes and then removing the developed photo resist on the conductive layer 14. In FIG. 12, the developed photoresist 47 is shown on the conductive layer 14.

As will be seen in FIG. 1, the inner ends of the probes 19 preferably extend toward a radial center but terminate at a position short of the radial center. In the embodiment shown in FIG. 1, these positions define an opening 36 having a rectangular configuration although other configurations than rectangular may also be provided. The positions of termination of the inner ends of the probes 10 at the opening 36 correspond to the positions of the pads 38 (or teminals) on the periphery of the integrated circuit chip 40 in FIG. 1. When the integrated circuit chip 40 is connected in a system incorporating the chip, the pads 38 are connected by electrical leads to circuitry in such system.

Figure 13:
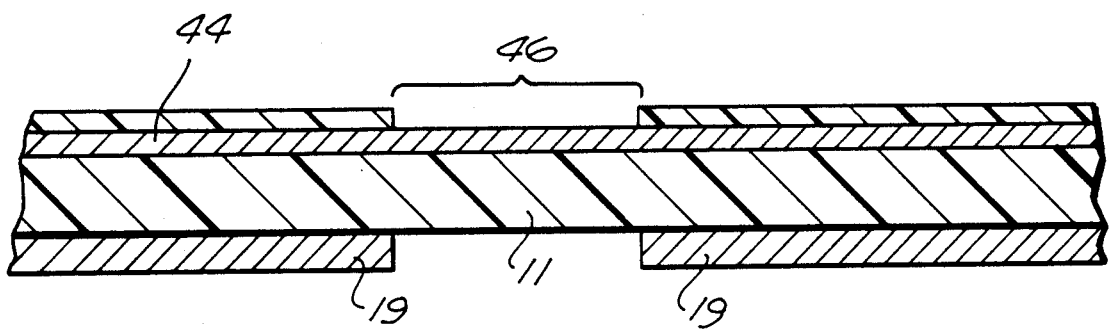

After the removal of the conductive material 14 in the spaces between the probes 19, a conductive ground plane 44 (FIG. 13) is formed on the surface of the dielectric substrate 11 opposite the probes 19. The conductive ground plane 44 is formed in a conventional manner from a suitable material such as copper. The copper may then be removed in a conventional manner from a central area 46 (FIG. 12) corresponding to the opening 36 defined by the inner ends of the probes 19. For example, this may be accomplished by disposing a photoresist material on the surface of the ground plane 44, developing all of the photoresist except in the central area 46, removing the undeveloped photoresist and the copper in the central area 46 and then removing the developed photoresist.

Figure 14:
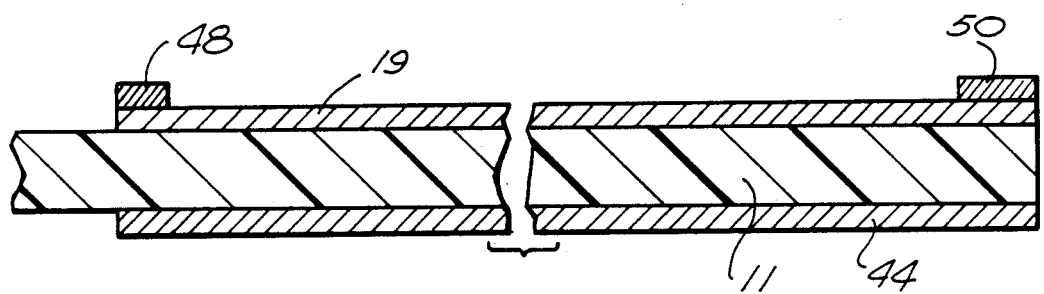

As will be appreciated, the probes 19 are planar at this time. However, it would be desirable to develop conductive contacts (or bumps) 48 (FIG. 14) on the inner ends of the probes 19 to engage the pads 38 and establish positive electrical contacts with the pads. It would also be desirable to develop conductive contacts (or bumps) 50 on the outer ends of the probes 19 to engage leads 52 on a printed circuit board generally indicated at 54 in FIG. 1 and establish positive electrical contacts with such leads.

The contacts 48 and 50 may be formed in a conventional manner as by initially coating the ends of the probes 19 with a suitable material such as nickel and then coating the nickel contacts with a suitable material such as gold. An intermediate layer of nickel is desirable because it is highly conductive and establishes a good bond to the copper probes 19 and to the gold tips. Gold is even more electrically conductive than nickel. It is also chemically neutral.

The contacts 48 and 50 may be formed in a conventional manner as by coating the probes 19, and the spaces between the probes, with a photoresist material, developing the photoresist at all of the positions except the positions of the contacts 48 and 50, removing the undeveloped photoresist at the positions of the contacts 48 and 50, forming the nickel, and then the gold, at the positions of the contacts 48 and 50 and then removing the developed photo resist.

As of this time in the formation of the probe card 10, the probes 19 and the ground plane 44 are planar. However, as will be seen in FIG. 2, it is desirable for a central portion 56 of the probe card 10 to be indented to facilitate engagement between the contacts 48 and the pads 38 on the integrated circuit chip 40 and to facilitate engagement between the contacts 50 and the leads 52 on the printed circuit board 54. This is facilitated by forming the probes 19 in groups clustered at the outer ends of the probes and by providing spaces 60 between the cluster of probes 19 in each group.

The probe card described above is used to test for the operability of the integrated circuit chip 40. The contacts 50 are individually attached to the leads 52 on the printed circuit board 54 or are at least placed in positive contact with the leads 52. The contacts 48 on the probe card are disposed in contact with the pads 38 on the integrated circuit chip 40. Since the leads 52 on the printed circuit board 54 are connected to testing circuitry which may be individually designed to test the integrated circuit chip 40, tests can now be performed to determine whether the integrated circuit chip 40 is constructed properly. The testing circuitry can be designed to make these tests automatically and in a minimal period of time.

As will be appreciated, thousands and even millions of units of an integrated circuit chip may be fabricated in an individual design. Because of this, a considerable number of probe cards may have to be fabricated to test this vast number of chips. An advantage of the methods described above, and the probe cards manufactured by such methods, is that the probe cards 10 are uniform. This results from the fact that none of the steps in the method is performed manually. This causes the different probe cards 10 of the same design to provide identical tests on the different units of a chip 40 of the same design.

The probe cards formed by the methods of this invention also have another distinct advantage. This results from the fact that the probes 19 on the probe card 10 are not undercut. In other words, the width of the probes 19 remains substantially constant at different positions along the height (or thickness) of the probes. This is particularly important when the probes 19 are relatively thick. This is important in insuring that the impedances presented by the probes 19 will be substantially uniform and predictable in different probe cards 10 of the same design. In the prior art, the probes have tended to be undercut, particularly when the thickness of the probes is relatively great, so that the impedances presented by the probes have not been completely predicable or uniform.

There are other important advantages to the methods described above and to the probe cards manufactured by such methods. For example, the different probes 19 in the probe cards engage the associated pads 38 on the integrated circuit chip 40 with substantially the same pressure. As a result, the impedances produced in the test circuitry by the different probes 19 on the probe card 10 are substantially constant. This is important in insuring a proper operation of the test circuitry in determining whether the integrated circuit chip 40 being tested has been constructed properly. This is particularly true when the chip operates at high frequencies, such as in the tens of megahertz, since the control of impedances in testing the operation of the chips is more important at high frequencies than at low frequencies. Another advantage in applicant's methods is that the probe cards 10, and particularly probe cards with large numbers of probes 19, can be constructed at a minimal cost.

The copper plating bath used in the above method may be that designated as copper bath M M/U by OMI International Corporation. This bath may be mixed with approximately one percent (1%) by volume of MacDermid Tartan Copper. The part to be plated may be initially soaked in a solution of one percent (1%) of sodium hydroxide (NaOH) by volume for a period of at least fifteen seconds (15 sec.). The part may then be rinsed in water or sprayed by water. The part may then be soaked in a mixture of approximately two percent (2%) of Kester acid solder flux, approximately one percent (1%) of hydrochloric acid (HCl) and approximately ninety seven percent (97%) of water ($H_2O$) for at least fifteen seconds and then rinsed with water or sprayed by water.

A negative lead of a power supply may then be connected to the part to be copper plated, the part being disposed in the copper bath, and a positive lead of the power supply may connected to the anode of the copper bath. The current level in the plating bath may then be adjusted to plate at a level of approximately twenty amperes (20A.) per square foot of the area on the part to be plated. In such a bath, the copper will plate on the part at a thickness of approximately one hundred and twenty five ten thousandths of an inch (0.0125") per hour. After the desired thickness of the copper plating has been achieved, the power in the plating bath may discontinued and the part may be removed from the plating bath and rinsed. The developed photo resist on the areas of the part other than the plated areas may then be stripped while the part is still wet.

The nickel plating bath may be that designated as Lectro-Nick 10-03S by Omi Intenational Corporation. The bath may be mixed MacDermid Nimac 8152 (No. 32-C) solution in accordance with directions provided by MacDermid for that solution. The part to be plated with nickel may be soaked in the mixture of Kester acid solder flux, hydrochloric acid and water in the same manner and for the same period of time as specified in the previous paragraph.

A negative lead of a power supply may then be applied to the part to be plated, the part being disposed in the nickel plating bath described above, and a nickel anode may be connected to the positive terminal of the power supply. The current level in the bath may then be adjusted to plate the part with nickel at a current of approximately fifteen amperes per square foot (15 A/sq. ft.). The plating may be continued until the desired thickness of nickel has been plated on the part. The part may thereafter be removed from the plating bath and rinsed with water. The gold layer may then be plated on the nickel layer The gold plating bath may be that designated as BDT 510 M/U gold by Omi International Corporation. This bath may be used without any modification. As an initial step, the part to be gold plated may then be rinsed with water. The negative lead of a power supply may be connected to the part to be plated, the part being disposed in the plating bath, and the positive lead of the power supply may be connected to a platinum plated titanium anode. The current level in the bath may then be adjusted to a value of approximately one and one half amperes per square foot (1.5 A/sq. ft.) of the part to be plated. The plating may occur for approximately thirty seconds (30 sec.). The part may then be removed from the plating bath and rinsed with water.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. A method of making a probe card having probes for engaging pads on an integrated circuit chip and leads on a printed circuit board, including the steps of:
   providing a support plate,
   forming the probes on the support plate in a pattern to engage the pads on the integrated circuit chip and to engage the leads on the printed circuit board,
   transferring the probes from the support plate to one side of a dielectric substrate,
   forming a ground plane on the other side of the substrate, and
   forming contacts at the ends of the probes to engage the pads on the integrated circuit chip and the leads on the printed circuit board.

2. A method as set forth in claim 1 wherein
   the probes are formed to extend radially toward a central position and to define an opening at the central position and the ground plane is formed to define the opening at the central position.

3. A method as set forth in claim 1 wherein
   the probes are made from copper and the support plate is made from a material having a low affinity to copper and wherein the copper probes are peeled from the support plate when the copper probes are transferred from the support plate to the dielectric substrate.

4. A method as set forth in claim 1 wherein
   a thin covering of a conductive material is initially disposed uniformly on the support plate and the probes are formed on the thin conductive material and the thin conductive material and the probes are transferred from the support plate to the dielectric substrate and the thin covering of the conductive material is removed from the substrate at the positions other than the positions of the probes.

5. A method of making a probe card having probes for engaging pads on an integrated circuit chip and leads on a printed circuit board, including the following steps:
   providing a support plate,
   forming on the support plate a thin layer of an electrically conductive material with properties of being easily removed from the support plate,
   forming the probes on the thin conductive layer,
   transferring the probes on the thin conductive layer from the support plate to a first surface of a dielectric substrate,
   removing the thin layer of the electrically conductive material from the substrate in the spaces between the probes, and
   forming a ground plane on the second surface of the dielectric substrate.

6. A method as set forth in claim 5 wherein
   the probes extend to central positions corresponding to the positions of the pads on the integrated circuit chip to define an opening at such central positions, and
   removing the ground plane at the central positions corresponding to the opening on the first surface of the substrate.

7. A method as set forth in claim 6, including the step of:
   providing contacts on the probes at first mode of the probes at positions adjacent to the central opening to contact the pads on the integrated circuit chip and providing contacts on the probes at second ends of the probes opposite the first ends to contact the leads on the printed circuit board.

8. A method as set forth in claim 6, including the steps of:
   the probes being formed on the conductive material in the following manner:
   applying a photo resist to the thin layer of the conductive material applying an emulsion to the photo resist in a pattern corresponding to the pattern of the probes on the support plate,
   applying light to the photoresist in the areas other than the areas of the emulsion to develop the photo resist in these other areas, removing the emulsion, forming the probes on the conductive material in the areas previously occupied by the emulsion, and removing the developed photo resist.

9. A method of making a probe card having probes for engaging pads on an integrated circuit chip and leads on a printed circuit board, including the steps of:

providing a support plate, forming a thin layer of a conductive material on the support plate, forming the probes on the conductive material on the support plate, adhering a first surface of a dielectric substrate to the probes on the conductive material, and removing the dielectric substrate and the probes from the support plate.

10. A method as set forth in claim 9, including the step of:

forming a ground plane on a second surface of the dielectric substrate opposite to the first surface of the dielectric substrate.

11. A method as set forth in claim 9, including the step of:

removing the thin layer of the conductive material from the first surface of the dielectric substrate in the areas not occupied by the probes after the transfer of the probes to the dielectric substrate.

12. A method as set forth in claim 11, including the steps of:

forming a ground plane on a second surface of the dielectric substrate opposite the first surface of the dielectric substrate, and forming contacts at first ends of the probes for engagement with the pads on the integrated circuit chip and forming contacts at second ends of the probes for engagement with the leads on the printed circuit board.

13. A method of making a probe card having probes for engaging pads on an integrated circuit chip and leads on a printed circuit board, including the steps of:

providing an emulsion on a disposable member in a pattern corresponding to the pattern of the probes, covering the emulsion, and the spaces between the emulsion, with a material having a greater adhesion to the thin layer of the conductive material on a support member than to the disposable member, attaching the adhesive material to the support member, removing the disposable member, removing the emulsion, and forming the probes in the spaces previously occupied by the emulsion.

14. A method as set forth in claim 13, including the steps of:

attaching the probes to a first surface of a dielectric substrate with a material having a greater affinity to the dielectric substrate than to the support member, and removing the probes and the dielectric substrate from the support member.

15. A method as set forth in claim 14, including the steps of:

forming a ground plane on a second surface of the dielectric substrate, and forming contacts on a first end of the probes for engagement with the pads on the integrated circuit chip and forming contacts on a second end of the probes for engagement with the leads on the printed circuit board.

16. A method as set forth in claim 15, including the steps of:

forming the first ends of the probes to define an open area central to the probes, and forming a central open area in the ground plane at a position corresponding to the central open area defined by the first ends of the probes.

17. A method of making a probe card having probes for engaging pads on an integrated circuit chip and leads on a printed circuit board, including the steps of:

forming the probes on a support member, providing a dielectric substrate, covering the probes with a material having a greater affinity for the dielectric substrate than for the support member, applying the dielectric substrate to the affinity material on the support member so that the dielectric substrate and the support member are retained in fixed and contiguous relationship by the affinity material, and removing the dielectric substrate and the probes and the affinity material from the support member.

18. A method as set forth in claim 17, including the steps of forming a ground plane on the surface of the support member opposite the surface on which the probes are disposed, and forming contacts on the ends of the probes.

19. A method as set forth in claim 17, including the steps of forming the probes on the support member so that they extend inwardly and the inner ends of the probes define a centrally disposed space, and forming a centrally disposed space in the ground plane at a position corresponding to the centrally disposed space defined by the probes.

20. A method as set forth in claim 17 wherein the steps of forming the probes include the steps of:

providing a facsimile of the probes on a disposable member, providing a photoresist on the support member, adhering the probe facsimiles to the support member in a relationship providing for an easier removal of the disposable member from the facsimile than the support member from the facsimile, applying light to the photoresist in the areas on the support member where the facsimiles are not disposed so as to develop the photo resist in these areas.

removing the disposable member from the support member, removing the probe facsimiles from the support member, and forming the probes on the support member in the spaces previously occupied by the probe facsimiles.

21. A method of making a probe card having probes for engaging pads on an integrated circuit chip and leads on a printed circuit board, including the following steps:

providing an emulsion on a disposable member in a pattern corresponding to the pattern of the probes on the probe card, providing an affinity material on the emulsion and in the spaces between the emulsion, providing a photo resist material on a support member, adhering the affinity material to the support member material to obtain the adherence of the emulsion and the disposable member to the support member, the affinity material having a greater affinity to the support member than to the disposable member, detaching the disposable member from the emulsion and the affinity material, applying the light to the photoresist material in the areas not occupied by the emulsion to develop the photo resist in these areas, removing the affinity material and the emulsion from the support member in the undeveloped areas of the photo resist material, and forming the probes in the space in which the emulsion previously existed.

22. A method as set forth in claim 21, including the steps of:

transferring the probes to a first surface of a dielectric substrate, and forming a ground plane on the second surface of the dielectric substrate.

23. A method as set forth in claim 21, wherein the step of transferring the probes to the first surface of the dielectric substrate includes the steps of disposing, on the probes and the surface of the support member, an epoxy having properties, when cured, of having a greater affinity for the dielectric substrate than for the probes and the support member, disposing the dielectric substrate on the epoxy and curing the epoxy.

24. A method as set forth in claim 21 including the steps of providing a thin layer of a conductive material on the support member, forming the probes on the thin layer of the conductive material, transferring the thin layer of the conductive material to the dielectric substrate and thereafter removing the thin layer of the conductive material from the dielectric substrate in the areas not occupied by the probes.

25. A method of making a probe card having probes for engaging pads on an integrated circuit chip and leads on a printed circuit board, including the steps of:

providing a facsimile of the probes on a disposable member, providing a photoresist on the support member, adhering the probe facsimiles to the support member in a relationship providing an easier removal of the disposable member from the facsimiles than the support member from the facsimiles, applying light to the photoresist in the areas on the support member where the facsimiles are not disposed so as to develop the photo resist in these areas, removing the disposable member from the support member, removing the probe facsimiles from the support member, and forming the probes on the support member in the spaces previously occupied by the facsimiles.

26. A method as set forth in claim 25, including the step of removing the developed photoresist from the support member in the areas not occupied by the probes after the formation of the probes on the support member.

27. A method as set forth in claim 26, including the steps of:

transferring the probes from the support member to a first surface of a dielectric substrate, and forming a ground plane on the opposite surface of the dielectric substrate.

28. A method as set forth in claim 27, including the step of forming contacts on the probes at a first end of the probes for engaging the pads on the integrated circuit chip and forming contacts at the opposite ends of the probes.

29. In a method of making a probe card having probes for engaging pads on an integrated circuit chip and leads on a printed circuit board, the steps of:

forming a layer of a circuit material on a support plate, disposing a photo resist on the layer of the conductive material, disposing an emulsion on a sheet of material in a pattern corresponding to the pattern of the probes, covering the emulsion and the other areas on the sheet with a material having a greater affinity to the emulsion than to the sheet of material, affixing the emulsion and the affinity material to the photo resist on the support plate, removing the sheet of material from the emulsion, applying light in the areas other than the areas of the emulsion to develop the photo resist in these other areas, removing the emulsion and the affinity material from the support plate in the undeveloped areas of the photo resist, forming the probes on the conductive material in the areas previously occupied by the emulsion, and removing the developed photoresist material.

30. In a method as set forth in claim 29, wherein the emulsion, the affinity material and the sheet of material are attached to the support plate by pressing the sheet of material against the support plate, and the sheet of material is then peeled from the emulsion and the affinity material on the support plate before the photoresist is developed.

31. In a method as set forth in claim 29, the steps of affixing the probes to one surface of a dielectric substrate, and removing the probes an the dielectric substrate from the support plate.

32. In a method as set forth in claim 31, the step of providing a ground plane on a second surface of the dielectric substrate opposite the first surface.

33. In a method as set forth in claim 32, the step of:

forming contacts on one end of the probes for engaging the pads on the integrated circuit chip and forming contacts on the opposite end of the probes for engaging the leads on the printed circuit board.

* * * * *